(12) United States Patent
Uekido

(10) Patent No.: US 9,276,139 B2
(45) Date of Patent: Mar. 1, 2016

(54) POLYIMIDE FILM PRODUCTION METHOD, POLYIMIDE FILM PRODUCTION APPARATUS, AND POLYIMIDE FILM

(75) Inventor: Takeshi Uekido, Ube (JP)

(73) Assignee: UBE INDUSTRIES, LTD., Yamaguchi (JP)

( * ) Notice: Subject to any disclaimer, the term of this patent is extended or adjusted under 35 U.S.C. 154(b) by 35 days.

(21) Appl. No.: 14/007,079

(22) PCT Filed: Mar. 19, 2012

(86) PCT No.: PCT/JP2012/056989
§ 371 (c)(1),
(2), (4) Date: Nov. 13, 2013

(87) PCT Pub. No.: WO2012/132986
PCT Pub. Date: Oct. 4, 2012

(65) Prior Publication Data
US 2014/0058060 A1 Feb. 27, 2014

(30) Foreign Application Priority Data
Mar. 25, 2011 (JP) .................................. 2011-068252

(51) Int. Cl.
*B29D 7/00* (2006.01)
*H01L 31/02* (2006.01)
(Continued)

(52) U.S. Cl.
CPC ................ *H01L 31/02* (2013.01); *B29C 41/28* (2013.01); *C08J 5/18* (2013.01); *H01L 31/0392* (2013.01);
(Continued)

(58) Field of Classification Search
CPC B29C 2035/0822; B29C 41/28; B29C 41/36; B29C 41/46; B29C 65/1412; B29C 65/1612; B29K 2079/08; C08J 2379/08; C08J 5/18; H01L 31/02; H01L 31/0392; Y02E 10/50
See application file for complete search history.

(56) References Cited

U.S. PATENT DOCUMENTS

| | | | |
|---|---|---|---|
| 2007/0221096 A1* | 9/2007 | Fujihara et al. | 106/287.3 |
| 2009/0197068 A1* | 8/2009 | Yamaguchi et al. | 428/220 |
| 2012/0193829 A1* | 8/2012 | Ikeuchi et al. | 264/212 |

FOREIGN PATENT DOCUMENTS

| | | |
|---|---|---|
| EP | 431636 A1 | 6/1991 |
| JP | 3-180343 A | 8/1991 |

(Continued)

OTHER PUBLICATIONS

Related U.S. Appl. No. 14/389,159; First Named Inventor: Takeshi Uekido; Title: "Method for Producing Polyimide Film, and Polyimide Film"; filed Sep. 29, 2014.

(Continued)

*Primary Examiner* — Stella Yi
(74) *Attorney, Agent, or Firm* — Holtz, Holtz & Volek PC

(57) ABSTRACT

A polyimide film which rarely undergoes the formation of bubbles, blisters or the like, even when heated to a high temperature; and a production method and a production apparatus for the polyimide film. The polyimide film production apparatus includes a support body, a cast furnace and a cure furnace, wherein the cure furnace is partitioned into multiple zones so that the temperature of a self-supporting film can be increased in a stepwise manner, and an infrared electric heater, which is disposed at a predetermined distance from the film, is arranged in a zone for heating the atmosphere of the self-supporting film to a temperature of 450° C. or higher on the upper surface side and/or the lower surface side of the self-supporting film. The polyimide production apparatus enables the production of a polyimide film which has a volatile content of 0.1 mass % or less after being heated at 450° C. for 20 minutes.

4 Claims, 2 Drawing Sheets

(51) Int. Cl.
- *B29C 41/28* (2006.01)
- *C08J 5/18* (2006.01)
- *H01L 31/0392* (2006.01)
- *B29K 79/00* (2006.01)
- *B29C 35/08* (2006.01)

(52) U.S. Cl.
CPC ..... *B29C 2035/0822* (2013.01); *B29K 2079/08* (2013.01); *C08J 2379/08* (2013.01); *Y02E 10/50* (2013.01)

(56) References Cited

FOREIGN PATENT DOCUMENTS

| | | | |
|---|---|---|---|
| JP | 06313055 | A | 11/1994 |
| JP | 9-291159 | A | 11/1997 |
| JP | 2000091606 | A | 3/2000 |
| JP | 2004051972 | A | 2/2004 |
| JP | 2006-335875 | A | 12/2006 |
| JP | 2008111074 | A | 5/2008 |
| JP | 2009-185101 | A | 8/2009 |
| JP | 2009-241329 | A | 10/2009 |
| JP | 2009263658 | A | 11/2009 |
| JP | 2011165832 | A | 8/2011 |
| WO | WO 2011043438 | A1 * | 4/2011 |
| WO | 2012050072 | A1 | 4/2012 |

OTHER PUBLICATIONS

International Search Report mailed Jun. 26, 2012 for PCT/JP2012/056989.

JP 2009-006542 A Ube Industries, Ltd. Jan. 15, 2000.

* cited by examiner

POLYIMIDE FILM PRODUCTION METHOD, POLYIMIDE FILM PRODUCTION APPARATUS, AND POLYIMIDE FILM

CROSS-REFERENCE TO RELATED APPLICATION

This application is a United States national phase application of International Application PCT/JP2012/056989 filed Mar. 19, 2012.

TECHNICAL FIELD

The present invention relates to a method for manufacturing a polyimide film, a device for manufacturing a polyimide film, and a polyimide film that can be suitably used in a solar cell substrate or the like for which high-temperature treatment is necessary.

BACKGROUND ART

Polyimide films have high heat resistance and high electrical insulation properties, and even a polyimide film of thin make provides rigidity, heat resistance or electrical insulation properties necessary for handling. Polyimide films are therefore widely used in the industrial fields of electrical insulation films, heat shielding films, base films for flexible circuit boards, and the like. Polyimide films have also recently come to be used in solar cell substrates and the like.

A polyimide film is manufactured by a process including a casting step for flow-casting and applying a film-shaped coating of a polyimide precursor solution such as polyamic acid, for example, on a support, heating and drying the product, and forming a self-supporting film having self-supporting properties, and a curing step for heat treating the self-supporting film and completing imidization thereof. A surface treatment agent or other organic solvent may also be applied to a surface of the self-supporting film and dried to perform a surface treatment as needed after the casting step, and the curing step may be subsequently performed.

Solvents and other volatile substances are removed from the polyimide film by the heat treatment in the curing step, but complete removal thereof is difficult, and small amounts remain in the final product. Patent Document 1 discloses an aromatic polyimide film in which the volatile content is 0.2 mass % or less.

If a polyimide film is not used in an application that involves heating to a high temperature, the occurrence of blistering, foaming, and other defects of the polyimide film during product manufacturing can be suppressed in a manner in which the volatile content is reduced to about 0.2 mass %, as in Patent Document 1.

However, in the case of solar cells and the like, where the polyimide film is heated to high temperatures of 450° C. or higher during product manufacturing, a volatile content of about 0.2 mass % cannot be considered adequate, and there is a risk of foaming, blistering, and other defects. In solar cells in particular, since the polyimide film is brought to a high temperature after a metal or inorganic layer is formed on both sides of the polyimide film, foaming or blistering readily occurs when even small amounts of volatile components are present in the polyimide film.

PRIOR ART DOCUMENTS

Patent Documents

[Patent Document 1] Japanese Laid-Open Patent Application No. 9-291159

DISCLOSURE OF THE INVENTION

Problems to be Solved by the Invention

An object of the present invention is to provide a polyimide film in which foaming, blistering, or the like does not readily occur even when the polyimide film is heated to a high temperature, and to provide a method for manufacturing the polyimide film and a device for manufacturing the polyimide film.

Means to Solve the Problems

As a result of concentrated investigation for the purpose of solving the aforementioned problems, the inventors discovered that using an infrared heater in a high-temperature region in the curing process for manufacturing a polyimide film makes it possible to manufacture a film having a low volatile content. The inventors also discovered that by heating the film so that the set temperature of the infrared heater is similar as the ambient temperature, for example, and not making the set temperature of the infrared heater too high, the risk of film decomposition due to excessive heating is eliminated, and a film having a low volatile content can be manufactured.

Specifically, the method for manufacturing a polyimide film according to the present invention includes:

a casting step for casting a polyimide precursor solution onto a support, drying the polyimide precursor solution, and forming a self-supporting film having self-supporting properties; and a curing step for peeling the self-supporting film obtained in the casting step from the support and heat treating the self-supporting film to complete imidization thereof;

characterized in that the curing step uses heating by an infrared heater during heat treatment of the self-supporting film in which the ambient temperature thereof is brought to 450° C. or higher.

Preferably, in the method for manufacturing a polyimide film according to the present invention, the curing step is configured so that the ambient temperature can be increased in stages by heating means, and the temperature of the self-supporting film can be increased in stages, and heating by the heating means and heating by the infrared heater are jointly used during heat treatment of the self-supporting film in which the ambient temperature is brought to 450° C. or higher by the heating means.

Preferably, the polyimide precursor is polyamic acid obtained by polymerizing a tetracarboxylic acid component containing 3,3',4,4'-biphenyltetracarboxylic acid dianhydride and a diamine component containing paraphenylenediamine.

Preferably, a polyimide film having a width of 200 mm or greater is continuously manufactured.

The device for manufacturing a polyimide film according to the present invention includes:

a support onto which a polyimide precursor solution is cast;

a casting furnace for drying a flow-cast product cast on the support and forming a self-supporting film having self-supporting properties; and a curing furnace for continuously heat treating, while conveying, the self-supporting film that has passed through the casting furnace and completing imidization thereof;

characterized in that the curing furnace is partitioned into a plurality of regions so that the temperature of the self-supporting film can be increased in stages; and an infrared heater is provided, with a predetermined interval from the self-supporting film, in a region where the self-supporting film is heat treated at an ambient temperature of 450° C. or higher, on a top surface side and/or a bottom surface side of the self-supporting film.

Preferably, in the device for manufacturing a polyimide film according to the present invention, the infrared heater is provided at a position 0.5 L to 1.0 L, L representing the furnace length of the curing furnace, and an entrance of the curing furnace being at 0 L.

The polyimide film of the present invention is a polyimide film obtained by the abovementioned method for manufacturing a polyimide film, characterized in that the volatile content thereof after 20 minutes of heating at 450° C. is 0.1 mass % or less.

The polyimide film of the present invention is preferably used as a substrate for a solar cell.

Advantageous Effects of the Invention

In the method for manufacturing a polyimide film according to the present invention, an infrared heater is used, or an infrared heater and heating means other than infrared heaters are jointly used during heat treatment in which the ambient temperature is increased to 450° C. or higher in the curing step. Solvents and other volatile components can therefore be efficiently removed from the polyimide film, and it is possible to efficiently manufacture a polyimide film in which the volatile content is extremely low, being 0.1 mass % or less after 20 minutes of heating at 450° C.

In the device for manufacturing a polyimide film according to the present invention, an infrared heater is provided, with a predetermined interval from the self-supporting film, in a region of the curing furnace where heat treatment is performed at an ambient temperature of 450° C. or higher, on a top surface side and/or a bottom surface side of the self-supporting film, and heat treatment is performed using the infrared heater or jointly using the infrared heater and heating means other than infrared heaters during heat treatment of the self-supporting film in which the ambient temperature is brought to 450° C. or higher. Solvents and other volatile components can therefore be efficiently removed from the polyimide film, and it is possible to efficiently manufacture a polyimide film in which the volatile content is extremely low, being 0.1 mass % or less after 20 minutes of heating at 450° C.

Furthermore, by the polyimide film of the present invention, since the volatile content after 20 minutes of heating at 450° C. is 0.1 mass % or less, the occurrence of volatile components is extremely low, and foaming or blistering can be suppressed even when the polyimide film is heated to a high temperature. The polyimide film can therefore be suitably used in solar cells and other applications where high-temperature heat treatment is necessary during product manufacturing.

BEST MODE FOR CARRYING OUT THE INVENTION

An embodiment of the polyimide film manufacturing apparatus of the present invention will be described using FIG. 1.

Figure 1:
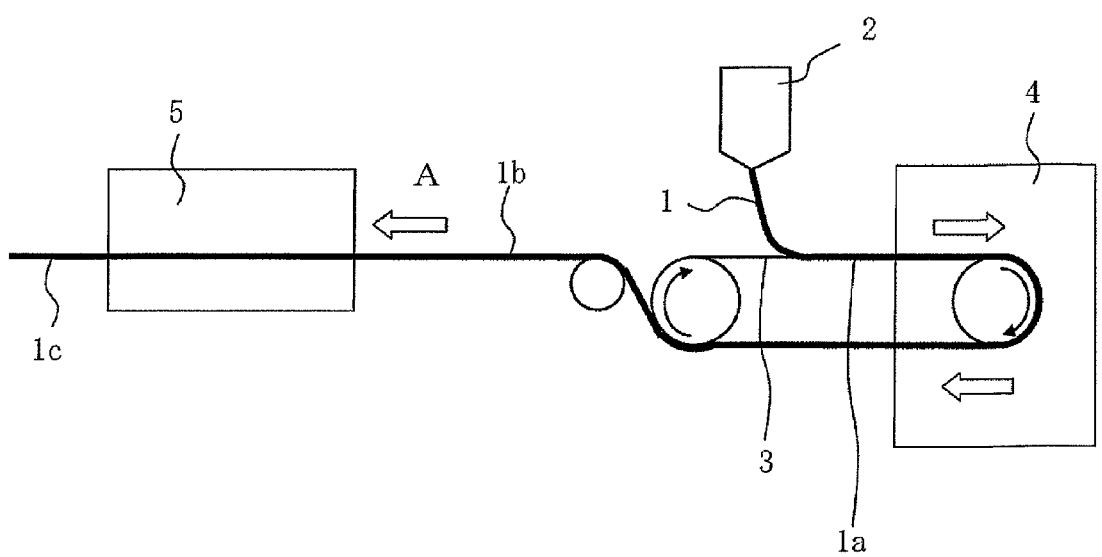
FIG. 1 is a schematic diagram of the polyimide film manufacturing apparatus of the present invention.

The polyimide film manufacturing apparatus shown in FIG. 1 is provided with a die 2 for extruding a polyimide precursor solution 1, a support 3 for casting the polyimide precursor solution 1 extruded from a distal end of the die 2, a casting furnace 4 for heat-drying a polyimide precursor flow-cast product 1a cast and forming a self-supporting film 1b, and a curing furnace 5 for heat-treating the self-supporting film 1b to complete imidization thereof and obtain a polyimide film 1c.

The support 3 is not particularly limited, and a metal belt, metal drum, or the like may be used.

Figure 2:
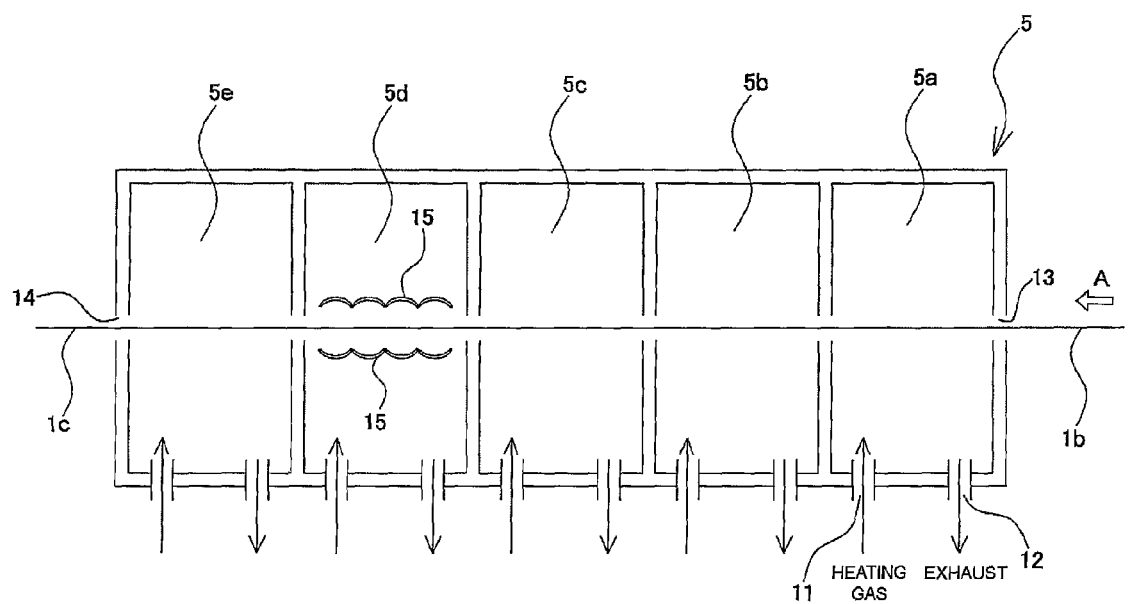
FIG. 2 is a schematic diagram of the curing furnace used in the polyimide film manufacturing apparatus.

Referring also to FIG. 2, the curing furnace 5 is provided with a plurality (five in the present embodiment) of heating chambers 5a, 5b, 5c, 5d, 5e arranged along the conveyance direction A of the self-supporting film 1b.

Each of the heating chambers is heated by heating means. The heating means may be heating gas, an infrared heater, induction heating, microwave heating, or the like. When heating gas is used as the heating means, for example, a gas introduction port 11 and a gas discharge port 12 are provided to each heating chamber, and the ambient temperature inside each heating chamber is adjusted to a predetermined temperature by a heating gas (hot air), as being the heating means, sent in from a hot air generating source not shown in the drawings. The ambient temperature in the heating chambers is adjusted so as to rise in stages in the order of heating chamber 5a, heating chamber 5b, heating chamber 5c, and heating chamber 5d. Specifically, the temperature of the self-supporting film 1b loaded into the curing furnace 5 from a loading port 13 is increased in stages by passing sequentially through the heating chambers 5a through 5d. The heating gas may be air, an inert gas such as nitrogen, or the like. A heating gas (hot air) is used as being the heating means in the description below, but the heating means is not limited to a heating gas.

The ambient temperature in the heating chamber 5e may be set higher than that of the heating chamber 5d, but in the heating chamber 5e, outside air flows in from an unloading port 14 for the polyimide film, and the temperature inside the chamber is prone to decrease. Therefore, since energy costs increase when the ambient temperature in the heating chamber 5e is set higher than that of the heating chamber 5d, it is preferred from the standpoint of the energy cost that the ambient temperature in the curing furnace 5 be set so as to be highest in the heating chamber 5d adjacent on the upstream side to the heating chamber 5e, rather than in the heating chamber 5e furthest downstream in the conveyance direction A of the self-supporting film.

In the heating chamber 5d, infrared heaters 15, 15 are provided, with a predetermined interval from the self-supporting film 1b conveyed in the chamber, on a top surface side and a bottom surface side of the self-supporting film 1b.

The infrared heater 15 is preferably controlled so as to be able to heat the self-supporting film 1b to ±50° C. of the ambient temperature in the heating chamber 5d.

The infrared heater 15 is preferably arranged so as to be able to heat the entire surface of the self-supporting film 1b passing through the heating chamber 5d, but may heat only a portion of the surface. For example, the region heated by the infrared heater 15 disposed in the heating chamber 5d is preferably 0.5 L' to 1.0 L', where L' represents the length of the inside of the heating chamber 5d in the conveyance direction. Using D to represent the length of the inside of the heating chamber 5d in the width direction (perpendicular to the conveyance direction), the heated region is preferably 0.8 D to 1.0 D.

The distance between the self-supporting film 1b and the infrared heater 15 is preferably 5 to 300 mm, and more preferably 10 to 200 mm. When this distance is less than 5 mm, travel of the film in the furnace is obstructed, or problems may be difficult to address. When the distance exceeds 300 mm, the efficiency with which solvents and the like are removed tends to decrease.

The infrared heaters 15 are each provided on the top surface side and the bottom surface side, respectively, of the self-supporting film 1b conveyed in the chambers in the present embodiment, but a configuration may be adopted in which an infrared heater is provided on only the top surface side or the bottom surface side of the self-supporting film 1b.

The ambient temperature in each heating chamber varies according to the furnace length of the heating chamber, the solvent content of the self-supporting film loaded into the curing furnace 5, the imidization rate, and other factors, and is therefore not particularly limited. It is sufficient, however, insofar as the ambient temperature in each heating chamber is adjusted so that the temperature of the self-supporting film 1b loaded into the curing furnace 5 can be increased in stages until reaching a final heating temperature of 450° C. or higher.

In the present embodiment, the ambient temperature in the heating chamber 5d, which is set to the highest temperature, is set to 450° C. or higher, preferably 470 to 600° C., and more preferably 480 to 580° C.

In the present embodiment, the heating chamber in which hot air and the infrared heater are jointly used is the region (maximum heating region) in which the temperature is the highest among the curing steps, but this configuration is not limiting. There may also be a plurality of heating chambers in which the ambient temperature is 450° C or higher. In this case, hot air and the infrared heater may be jointly used in one or more of the heating chambers in which the temperature is 450° C. or higher.

In the curing furnace 5, the heating chamber in which hot air and the infrared heater are jointly used is preferably positioned in the latter half of the curing furnace as a whole. More specifically, the position of the abovementioned heating chamber is preferably 0.5 L to 1.0 L, more preferably 0.6 L to 1.0 L, and particularly preferably 0.6 L to 0.8 L, where L represents the furnace length (length of the furnace in the conveyance direction of the film) of the curing furnace, and the entrance of the curing furnace is at 0 L. The position of the infrared heaters is preferably 0.5 L to 1.0 L, more preferably 0.6 L to 1.0 L, and particularly preferably 0.6 L to 0.8 L, where L represents the furnace length of the curing furnace, and the entrance of the curing furnace is at 0 L.

Since the self-supporting film includes a relatively large amount of solvent immediately after being loaded into the curing furnace 5, a large amount of the solvent abruptly evaporates when the film is abruptly heated to a high temperature, and there is a risk of cracking and other problems on the film surface. The ambient temperature of the heating chamber 5a is therefore preferably 70 to 200° C., and more preferably 80 to 180° C.

As a specific example, the ambient temperature of the heating chamber 5a is preferably set to 70 to 200° C., more preferably 80 to 180° C., the ambient temperature of the heating chamber 5b is preferably set to 100 to 250° C., more preferably 130 to 230° C., the ambient temperature of the heating chamber 5c is preferably set to 200 to 400° C., more preferably 250 to 380° C., the ambient temperature of the heating chamber 5d is preferably set to 450° C. or higher, preferably 470 to 600° C., and more preferably 480 to 580° C., and the ambient temperature of the heating chamber 5e is preferably set to 80 to 400° C., more preferably 100 to 300° C. The infrared heater 15 is also controlled so that the surface temperature of the self-supporting film 1b is increased to preferably 450 to 600° C., and more preferably 480 to 550° C.

The method for manufacturing a polyimide film of the present invention will next be described using an example of a case in which the polyimide film manufacturing apparatus described above is used.

[Casting Step]

The polyimide precursor solution 1 is extruded from the distal end of the die 2 and cast onto the support 3, and a polyimide precursor flow-cast product 1a in a film shape is formed.

A polyamic acid solution as a polyimide precursor solution can be obtained by reacting a tetracarboxylic acid component and a diamine component by a publicly known method. For example, a tetracarboxylic acid component and a diamine component can be polymerized in an organic solvent commonly used to manufacture a polyimide.

The tetracarboxylic acid component may be an aromatic tetracarboxylic acid dianhydride, an aliphatic tetracarboxylic acid dianhydride, an alicyclic tetracarboxylic acid dianhydride, or the like. Specific examples thereof include aromatic tetracarboxylic acid dianhydrides such as 3,3',4,4'-biphenyl tetracarboxylic acid dianhydride, pyromellitic acid dianhydride, 3,3',4,4'-oxydiphthalic acid dianhydride, diphenylsulfone-3,4,3',4'-tetracarboxylic acid dianhydride, bis(3,4-dicarboxyphenyl)sulfide dianhydride, and 2,2-bis(3,4-dicarboxyphenyl)-1,1,1,3,3,3-hexafluoropropane dianhydride.

The diamine component may be an aromatic diamine, an aliphatic diamine, an alicyclic diamine, or the like. Specific examples thereof include aromatic diamines such as p-phenylene diamine, 4,4'-diaminodiphenyl ether, 3,4'-diaminodiphenyl ether, m-tridine, p-tridine, 5-amino-2-(p-aminophenyl)benzoxazole, 4,4'-diamino benzanilide, 1,3-bis(4-aminophenoxy)benzene, 1,4-bis(3-aminophenoxy)benzene, 1,4-bis(4-aminophenoxy)benzene, 3,3'-bis(3-aminophenoxy)biphenyl, 3,3'-bis(4-aminophenoxy)biphenyl, 4,4'-bis(3-aminophenoxy)biphenyl, 4,4'-bis(4-aminophenoxy)biphenyl, bis[3-(3-aminophenoxy)phenyl] ether, bis[3-(4-aminophenoxy)phenyl] ether, bis[4-(3-aminophenoxy)phenyl] ether, bis[4-(4-aminophenoxy)phenyl] ether, 2,2-bis[3-(3-aminophenoxy)phenyl] propane, 2,2-bis[3-(4-aminophenoxy)phenyl] propane, 2,2-bis[4-(3-aminophenoxy)phenyl] propane, and 2,2-bis[4-(4-aminophenoxy)phenyl] propane.

The examples 1) through 3) below are cited as examples of the combination of the tetracarboxylic acid component and the diamine component from the perspectives of mechanical characteristics and heat resistance.

1) A combination of 3,3',4,4'-biphenyl tetracarboxylic acid dianhydride; and p-phenylene diamine, or p-phenylene diamine and 4,4-diaminodiphenyl ether (e.g., with a PPD/DADE mole ratio preferably of 100/0 to 85/15).

2) A combination of 3,3',4,4'-biphenyl tetracarboxylic acid dianhydride and pyromellitic dianhydride (e.g., the s-BPDA/PMDA mole ratio is preferably 0/100 to 90/10); and p-phenylene diamine, or p-phenylene diamine and 4,4-diaminodiphenyl ether (e.g., with a PPD/DADE mole ratio preferably of 90/10 to 10/90).

3) A combination of pyromellitic dianhydride; and p-phenylene diamine and 4,4-diaminodiphenyl ether (e.g., with a PPD/DADE mole ratio preferably of 90/10 to 10/90).

A publicly known solvent can be used as the abovementioned organic solvent, and examples thereof include N-methyl-2-pyrrolidone, N,N-dimethylformamide, N,N-dimethylacetamide, N,N-diethylacetamide, and the like. These organic solvents may be used singly, or two or more types thereof may be jointly used.

When imidization of the polyimide precursor solution is brought to completion by thermal imidization, an imidization catalyst, an organic phosphorus-containing compound, inorganic microparticles, organic microparticles, or the like may be added to the polyamic acid solution as needed.

When imidization of the polyimide precursor solution is brought to completion by chemical imidization, a cyclization catalyst, a dehydrating agent, inorganic microparticles, organic microparticles, or the like may be added to the polyamic acid solution as needed.

The imidization catalyst may be a substituted or non-substituted nitrogen-containing heterocyclic compound, an N-oxide compound of such a nitrogen-containing heterocyclic compound, a substituted or non-substituted amino acid compound, or an aromatic hydrocarbon or aromatic heterocyclic compound having a hydroxyl group.

The cyclization catalyst may be an aliphatic tertiary amine, an aromatic tertiary amine, a heterocyclic tertiary amine, or the like.

The dehydrating agent may be an aliphatic carboxylic acid anhydride, an aromatic carboxylic acid anhydride, or the like.

Examples of the microparticles include inorganic oxide powders such as, in a form of microparticulate, titanium dioxide powder, silicon dioxide (silica) powder, magnesium oxide powder, aluminum oxide (alumina) powder, and zinc oxide powder; inorganic nitride powders such as, in a form of microparticulate, silicon nitride powder and titanium nitride powder; inorganic carbide powders such as silicon carbide powder; and inorganic salt powders such as, in a form of microparticulate, calcium carbonate powder, calcium sulfate powder, and barium sulfate powder. These inorganic microparticles may be used in combinations of two or more types thereof. A publicly known means may be applied to uniformly disperse the inorganic microparticles.

Examples of inorganic microparticles include polyimide particles, cross-linked resin particles, and the like.

The solid concentration (polymer component) of the polyimide precursor solution is not particularly limited insofar as a viscosity range is yielded that is suitable for film manufacturing by flow casting. It is preferably 10 mass % to 30 mass %, more preferably 15 mass % to 27 mass %, and more preferably 16 mass % to 24 mass %.

The polyimide precursor flow-cast product $1a$ is introduced into the casting furnace 4 and heat-dried, and a self-supporting film $1b$ have self-supporting properties is formed.

Here, to have self-supporting properties means that the film has strength sufficient to enable the film to be peeled from the support 3.

The drying conditions (heating conditions) for forming the self-supporting film $1b$ are not particularly limited, but the self-supporting film $1b$ can be manufactured by heating to a temperature of 100 to 180° C. for about 2 to 60 minutes in thermal imidization.

Until the self-supporting film $1b$ can be peeled from the support 3, the solvent may be removed and/or the imidization may be performed. Thermal imidization is preferably performed so that the heating loss is 20 to 50 mass %. With a heating loss in the range of 20 to 50 mass %, the self-supporting film has adequate mechanical properties.

Here, the "heating loss" of the self-supporting film $1b$ is the value calculated by the following formula from the mass W1 of the self-supporting film and the mass W2 of the cured film:

$$\text{Heating loss (mass \%)} = \{(W1-W2)/W1\} \times 100.$$

The self-supporting film $1b$ having passed through the casting furnace 4 is peeled from the support 3 and sent to the curing furnace 5, and a curing process is performed. The method for peeling the self-supporting film $1b$ from the support 3 is not particularly limited, and a peeling method whereby the self-supporting film $1b$ is cooled and applied with tension thereto via a roller, or another method may be used.

[Curing Step]

In the curing step, the self-supporting film $1b$ is introduced into the curing furnace 5 and heat treated, solvent removal and imidization are brought to completion, and a polyimide film $1c$ is obtained.

In heat treatment in the present embodiment, the ambient temperature of the self-supporting film $1b$ is increased in stages, and the self-supporting film $1b$ is heated until the final ambient temperature is 450° C. or higher. Specifically, heat treatment is initially performed with the ambient temperature of the self-supporting film $1b$ being a relatively low temperature of 70 to 200° C., the temperature is gradually increased until the final ambient temperature of the self-supporting film $1b$ is 450° C. or higher, preferably 470 to 600° C., and imidization of the self-supporting film $1b$ and solvent evaporation/removal are performed.

Convection heating using a hot air furnace has conventionally been used as the method for heat treating a film, for such reasons as easy temperature control, rapid heat transfer, excellent uniformity of temperature, and the ability to quickly eliminate volatilized solvents.

In contrast, since heating by infrared heater is a heat transfer by radiation, and heats the film directly, the ambient temperature around the film cannot be adequately controlled, and temperature control is considered to be difficult. In heat treatment by an infrared heater, since the temperature of the radiant element must be set higher than a target temperature in order to raise the temperature of the film to the target temperature, there is a risk that the film temperature may exceed the target temperature in some cases. As a result, there is a risk of a portion of the polyimide film decomposing in the curing process. Consequently, an infrared heater is considered difficult to use as the means for heat-treating a self-supporting film.

However, according to the present invention, an infrared heater is used, or an infrared heater and heating by heating means other than infrared heaters are jointly used during heating of the ambient temperature of the self-supporting film to 450° C. or higher, and a polyimide film having an unexpectedly low volatile content can thereby be manufactured. By jointly using an infrared heater and heating by heating means other than infrared heaters, a polyimide film having a low volatile content can be more efficiently manufactured.

When the infrared heater and heating by heating means (e.g., hot air) other than infrared heaters are jointly used, the temperature of the infrared heater may be set to similar temperature as the other heating means, e.g., to about ±50° C. of the temperature of the other heating means. Specifically, decomposition and other adverse effects on the polyimide film due to excessive heating can be prevented by heating the film so that the set temperature of the infrared heater is similar as the ambient temperature, for example, and not making the set temperature of the infrared heater too high.

The reason that a polyimide film having low volatile content can be manufactured by using an infrared heater alone or by joint use of an infrared heater and heating means other than infrared heaters as the heat treatment means is not necessarily clear, but the reason may be that the heat treatment means does not merely raise or lower the surface temperature of the polyimide film, but that some other effect is brought about.

In heating by the infrared heater 15, heating is preferably performed so that the surface temperature of the self-supporting film 1b reaches 450 to 600° C., more preferably 480 to 550° C.

By thus heat treating the self-supporting film 1b at a relatively low temperature at first, and gradually increasing the temperature, it is possible to suppress the occurrence of cracking and other defects due to abrupt evaporation/removal of the solvent from the self-supporting film 1b. By joint use of heating by the infrared heater 15 when the ambient temperature of the self-supporting film is increased to 450° C. or higher, it is possible to significantly reduce the amounts of solvents and other volatile substances that remain in the final product polyimide film.

The heating conditions in the curing furnace 5 will be described using FIG. 2 and citing a specific example.

First, in the heating chamber 5a adjusted to an ambient temperature of 70 to 200° C., preferably 80 to 180° C., the self-supporting film 1b is heat treated (first heat treatment) for 0.2 to 5 minutes.

The self-supporting film 1b is then heat treated (second heat treatment) for 0.2 to 5 minutes in the heating chamber 5b adjusted to an ambient temperature of 100 to 250° C., preferably 130 to 230° C.

The self-supporting film 1b is then heat treated (third heat treatment) for 0.2 to 5 minutes in the heating chamber 5c adjusted to an ambient temperature of 200 to 400° C., preferably 250 to 380° C.

The self-supporting film 1b is then heat treated for 0.2 to 5 minutes in the heating chamber 5d adjusted to an ambient temperature of 450° C. or higher, preferably 470 to 600° C., and more preferably 480 to 580° C. Hot air, for example, and the infrared heater 15 are jointly used in the heating chamber 5d, and heating is performed (fourth heat treatment) so that the surface temperature of the self-supporting film 1b reaches preferably 450 to 600° C., more preferably 480 to 550° C.

The self-supporting film 1b is then heat treated (fifth heat treatment) for 0.2 to 5 minutes in the heating chamber 5e adjusted to an ambient temperature of 80 to 400° C., preferably 100 to 300° C., and the polyimide film 1c is obtained.

In the curing furnace 5, heat treatment may be performed in a manner in which the long solidified film (self-supporting film) is fixed at least at both edges thereof in the direction at a right angle to the longitudinal direction, i.e., the width direction of the film, by a pin tenter, clips, a frame, or the like, which may be scaled as needed in the width direction or the length direction.

The polyimide film after the curing step is released from being fixed at both ends thereof. This polyimide film may be annealed using an infrared heater or the like to relax stress that remains in the polyimide film. In the present invention, the curing step for heating the self-supporting film using an infrared heater is distinct from the aforementioned annealing process.

The polyimide film 1c unloaded from the curing furnace 5 after having completed the curing step may be wound into a roll by a winding device or the like.

By the manufacturing method of the present invention, a polyimide film can be continuously produced having a width of 200 mm or greater, e.g., 300 mm or greater, preferably 500 mm or greater, more preferably 1000 mm or greater, and particularly preferably 1500 mm or greater.

The polyimide film obtained by the present invention has a volatile content of 0.1 mass % or less, preferably 0.09 mass % or less, and more preferably 0.08 mass % or less after being heated for 20 minutes at 450° C. When the volatile content of the polyimide film is 0.1 mass % or less, foaming or blistering can be suppressed and a good-quality product can be manufactured at a high yield, even in applications such as solar cell substrates where the polyimide film is heated to a high film temperature of 400° C. or higher in the product manufacturing process. In the present invention, the volatile content is the value measured by the method described in the example below.

The thickness of the polyimide film obtained by the present invention is not particularly limited, but is preferably 5 to 100 µm, and more preferably 7 to 80 µm.

The polyimide film obtained by the present invention can be used as a material for electronic components or electronic instruments; such as a cover base material for printed wiring boards, flexible printed substrates, TAB tape, COF tape, IC chips and other chip members, and the like, or a base material or cover base material for liquid crystal displays, organic electroluminescence displays, electronic paper, solar cells, and the like; or a solar cell substrate. The polyimide film is particularly preferred for use in applications such as solar cell substrates where heat treatment at high temperatures is necessary in the product manufacturing process, and the polyimide film is heated to a high film temperature of 400° C., preferably 450° C. or higher.

EXAMPLE (Method for Measuring Volatile Content)

The volatile content is calculated using the equation below, where A is the weight of the polyimide film after being heated for 10 minutes at 150° C., and B is the weight of the polyimide film after being heated for 20 minutes at 450° C.

$$\text{Volatile content} = [(A-B)/A] \times 100$$

(Example)

A polyimide precursor solution was prepared by mixing substantially equal mole amounts of 3,3',4,4'-biphenyl tetracarboxylic acid dianhydride and paraphenylenediamine in N,N-dimethylacetamide to give a monomer content of 18 mass %. The polyimide precursor solution thus obtained was continuously flow-cast from a slit of a T-die mold onto an endless-belt-shaped stainless steel support in a drying furnace, and a thin film was formed on the support. The thin film was dried at 120 to 140° C. while adjusting the temperature and heating time, and a long self-supporting film having a heating loss (solvent content) of 38% and an imidization rate of 13% was manufactured.

Both ends in the width direction of the self-supporting film were then grasped, the film was inserted into a curing furnace, and the self-supporting film was heated by hot air in ambient temperature conditions of 100° C.×1 minute, 150° C.×1 minute, 170° C.×1 minute, 200° C.×1 minute, and 260° C.×1 minute. The self-supporting film was then heated in an atmosphere adjusted to 500° C. by hot air, and heated for 2 minutes in an environment where infrared heaters (Infrastein heater, manufactured by NGK Insulators, Ltd., rated 200 V, 300 W) set to 500° C. were installed above and below the self-supporting film. The distance between the self-supporting film and the surface of each infrared heater was 40 mm. The infrared heaters were installed at a range of 0.6 L to 0.8 L, where L represents the furnace length of the curing furnace, and the entrance of the curing furnace is at 0 L. By subsequently cooling the product, a polyimide film having a thickness of 35 μm was obtained. The width of the film at this time was 300 mm. The volatile content of the polyimide film was 0.07 mass %.

(Comparative Example 1)

A polyimide film having a width of 300 mm was obtained in the same manner as in the example described above, except that infrared heaters were not used. The volatile content of this polyimide film was 0.14 mass %.

(Comparative Example 2)

A polyimide film having a width of 300 mm was obtained in the same manner as in the example described above, except that hot air was not used at the portion where there were infrared heaters set to 500° C. The volatile content of this polyimide film was 0.31 mass %.

DESCRIPTION OF NUMERALS

1: polyimide precursor solution
1a: polyimide precursor flow-cast product
1b: self-supporting film
1c: polyimide film
2: die
3: support
4: casting furnace
5: curing furnace
5a-5e: heating chambers
11: gas introduction port
12: gas discharge port
13: loading port
14: unloading port
15: infrared heater

The invention claimed is:

1. A method for manufacturing a polyimide film, comprising:
    a casting step for casting a polyimide precursor solution onto a support, drying the polyimide precursor solution, and forming a self-supporting film having self-supporting properties; and
    a curing step for peeling the self-supporting film obtained in the casting step from the support and heat treating the self-supporting film to complete an imidization thereof;
    wherein the curing step is carried out in a curing furnace, and the curing step is configured so that a heating means, not being an infrared heater, is operable to increase the ambient temperature in stages, thereby the temperature of the self-supporting film can be increased in stages,
    wherein an infrared heater is disposed at a position 0.5 L to 1.0 L, L representing the length of the curing furnace, and an entrance of the curing furnace being at 0 L, and
    wherein during a heat treatment of the self-supporting film in which the ambient temperature thereof is increased to a temperature of 450° C. or higher by the heating means, the heating means and heating by the infrared heater are jointly employed so as to increase the surface temperature of the self-supporting film to a temperature of 450° C. to 600° C.

2. The method for manufacturing a polyimide film according to claim 1, wherein the heating means comprises a heating gas.

3. The method for manufacturing a polyimide film according to claim 1, wherein the polyimide precursor is a polyamic acid obtained by polymerizing a tetracarboxylic acid component containing 3,3',4,4'-biphenyltetracarboxylic acid dianhydride and a diamine component containing paraphenylenediamine.

4. The method for manufacturing a polyimide film according to claim 1, wherein a polyimide film having a width of 200 mm or greater is continuously manufactured.

* * * * *